United States Patent [19]

Nakayama et al.

[11] Patent Number: 5,502,953
[45] Date of Patent: Apr. 2, 1996

[54] METHOD FOR TRANSPORTING/STORING A WAFER IN A WAFER CARRIER

[75] Inventors: Ichiro Nakayama, Kadoma; Masuo Tanno, Hirakata; Kazuhiro Mori, Katano, all of Japan

[73] Assignee: Matsushita Electric Industrial Co., Ltd., Osaka, Japan

[21] Appl. No.: 281,676

[22] Filed: Jul. 28, 1994

Related U.S. Application Data

[62] Division of Ser. No. 25,629, Mar. 2, 1993, Pat. No. 5,360,106.

[30] Foreign Application Priority Data

Mar. 3, 1992 [JP] Japan .................................. 4-45339

[51] Int. Cl.⁶ .................................................. B65B 23/00
[52] U.S. Cl. ........................... 53/468; 53/254; 53/473
[58] Field of Search ............................. 53/473, 467, 443, 53/254, 532, 468; 206/820, 330, 328

[56] References Cited

U.S. PATENT DOCUMENTS

| | | | |
|---|---|---|---|
| 3,904,259 | 9/1975 | Hoffmann et al. | 312/9.57 |
| 4,306,343 | 12/1981 | Rochat et al. | 206/330 X |
| 4,476,978 | 10/1984 | Saito | 206/444 |
| 4,685,277 | 8/1987 | Ilsemann | 53/254 X |
| 4,694,957 | 9/1987 | Ackeret | 206/309 |
| 4,771,887 | 9/1988 | Nehl | 206/387 |
| 4,852,327 | 8/1989 | Kurkowski et al. | 53/254 X |
| 4,863,031 | 9/1989 | Tanaka et al. | 206/444 |
| 4,905,217 | 2/1990 | King et al. | 206/444 X |
| 5,186,328 | 2/1993 | Lenz et al. | 206/330 |
| 5,213,209 | 5/1993 | Song | 206/309 |
| 5,319,846 | 6/1994 | Tarahashi et al. | 206/330 X |

*Primary Examiner*—James F. Coan
*Attorney, Agent, or Firm*—Wenderoth, Lind & Ponack

[57] ABSTRACT

A wafer transporting/storing method includes steps of accommodating one wafer in each flat casing, and transporting/storing the casing. A wafer carrier includes a flat casing, one side surface of which is opened as a wafer entrance/exit, a cover for closing the wafer entrance/exit, and a cover urging device, disposed between the casing and the cover, for urging the cover in a closed direction. The flat casing has a space for accommodating one wafer. In the carrier, at both sides of intermediate portions of the upper and lower surfaces of the space are inclined in the directions from each intermediate portion toward both ends of each of the upper and lower surfaces so that an interval between the upper and lower surfaces of the space becomes narrower toward both ends of the space.

10 Claims, 4 Drawing Sheets

METHOD FOR TRANSPORTING/STORING A WAFER IN A WAFER CARRIER

This is a divisional application of Ser. No. 08/025,629, filed Mar. 2, 1993, now U.S. Pat. No. 5,360,106.

BACKGROUND OF THE INVENTION

The present invention relates to a method for transporting/storing a wafer, and more particularly to a method for supplying or transporting to manufacturing processes a wafer, namely, a thin plate material, consisting of semiconductor, used as a substrate on which an IC is mounted. The present invention also relates to a transporting material, namely, a wafer carrier to be used to supply or, transport, the wafer to the manufacturing processes or to store the wafer.

The wafer is thin and thus breakable or chippable. The IC is affected in the quality and performance thereof when it is deformed excessively or an internal stress is applied thereto excessively. It is necessary to protect the surface of the wafer from becoming dusty or soiled. If the surface of the wafer is dusty or soiled or has slight damage thereto thereon, circuit having a fine construction cannot be formed.

In this respect, it is necessary to transport and store the wafer with much care so as to avoid the above-described disadvantages.

A known wafer carrier has the following construction. That is, it has a plurality of shelves approximately C-shaped in plan view to hold the periphery of circular wafers each inserted into the space of each C-shaped shelf. Normally, one carrier accommodating 25 wafers is collectively supplied to a necessary manufacturing process.

It is difficult for the conventional wafer carrier to handle wafers separately.

That is, when the specifications of IC chips mounted on the wafer and performances demanded therefor are different from each other, required processing contents of wafers and processing procedures thereof are different from each other. The wafer carrier handling a large number of wafers is incapable of supplying a right wafer to a right processing line or a right processing device. Therefore, wafers are removed from the wafer carrier or inserted thereinto individually.

It takes time and labor to removed a required wafer from the wafer carrier and return a processed wafer thereto in each process. In addition, a device for removing the wafer from the wafer carrier and a device for returning it thereto are complicated in construction. Further, if a wafer is removed from the wrong shelf of the wafer carrier or a processed wafer is returned to the wrong shelf of the wafer carrier and removed therefrom to perform a subsequent processing, a defective product is manufactured. Such a problem does not occur if wafers to be processed in the same manner are accommodated by one wafer carrier. It is very inefficient and uneconomical to accommodate several wafers in the wafer carrier capable of accommodating many more wafers, for example, 25 wafers.

SUMMARY OF THE INVENTION

It is an object of the present invention to provide a method for transporting/storing wafers without causing the problems of the conventional method, and for transporting them to manufacturing processes at a high speed.

It is another object of the present invention to provide a wafer carrier convenient for separating handling wafers depending on kind.

In accomplishing this and other objects, according to one aspect of the present invention, there is provided a wafer transporting/storing method comprising the steps of: accommodating one wafer in each flat casing; and transporting/storing the casing.

According to another aspect of the present invention, there is provided a wafer transporting/storing method comprising the of: accommodating each of a plurality of wafers in each of a plurality of flat casings; piling the casings one on the other; and transporting/storing the casings.

According to a further aspect of the present invention, there is provided a wafer carrier comprising: a flat casing having a space for accommodating one wafer, one side surface of which is opened as a wafer entrance/exit; a cover for closing the wafer entrance/exit; and a cover urging means, disposed between the casing and the cover, for urging the cover in a closed direction, wherein both sides of intermediate portions of the upper and lower surfaces of the space are inclined in the directions from each intermediate portion toward both ends of each of the upper and lower surfaces so that an interval between the upper and lower surfaces of the space becomes narrower toward both ends of the space.

According to the above-described method, one wafer is accommodated in each of the flat casings. Consequently, the wafer is not directly handled, but the casing accommodating the wafer is handled according to the processing content and processing order required for each wafer. Therefore, it is not likely that the wafer thin which will be broken or chipped in transporting and storing the wafer. In addition, the wafer will not be deformed excessively and no excessive internal stress is applied thereto while it is being handled. Thus, the wafer can be transported at a high speed in transporting it to a manufacturing process or a storing place.

When the wafer is accommodated in the wafer carrier, the right and left ends thereof may be pressed against the inclined surface formed in the casing and the forward and backward ends thereof may be sandwiched between the cover of the casing and the wafer urging means. Therefore, the wafer can be stably accommodated in the wafer carrier. The cover urging means for urging the cover of the casing in the closed direction is provided. Therefore, when the wafer is inserted into the wafer carrier, the cover is automatically closed. The wafer urging means for urging the wafer toward the entrance/exit of the casing may be provided in the backward portion of the space formed in the casing. In this case, when the cover of the entrance/exit is opened against the force of the cover urging means, the end of the wafer is discharged from the entrance/exit. Thus, the wafer can be removed from the casing easily.

BRIEF DESCRIPTION OF THE DRAWINGS

These and other objects and features of the present invention will become clear from the following description taken in conjunction with the preferred embodiments thereof with reference to the accompanying drawings, in which.

DETAILED DESCRIPTION OF THE INVENTION

Figure 1:
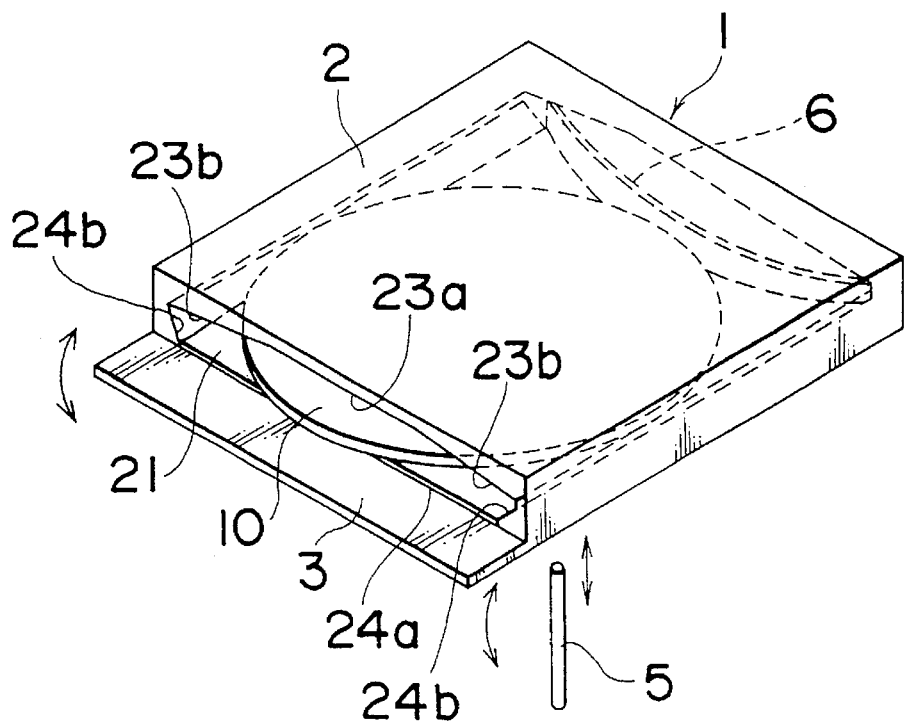
FIG. 1 is a perspective view showing a wafer carrier according to an embodiment of the present invention.

Before the description of the present invention proceeds, it is to be noted that like parts are designated by like reference numerals throughout the accompanying drawings.

Figure 2:
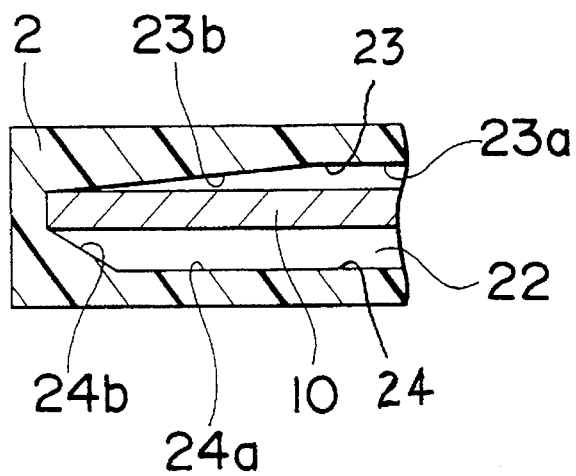
FIG. 2 is an enlarged sectional view showing a principal portion of a wafer accommodated in the wafer carrier.

Referring to FIGS. 1 and 2, a wafer carrier and a method for transporting/storing a wafer according to an embodiment of the present invention is described below.

Figure 3:
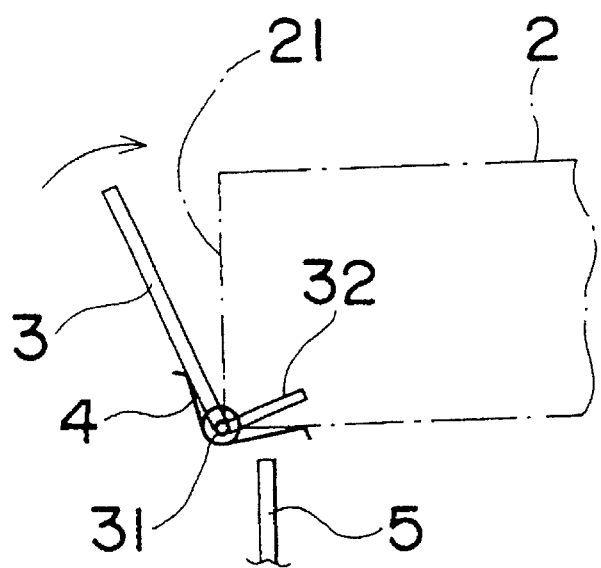
FIG. 3 is a partial side elevation showing a method for mounting the cover of the wafer carrier on a wafer carrier casing.

FIG. 1 shows a wafer carrier 1 according to the embodiment of the present invention. FIG. 2 shows an enlarged view of the inside of the wafer carrier 1. The wafer carrier 1 has a flat casing 2 and a cover 3, which is pivotal to close a wafer entrance/exit 21, provided on one side of the casing 2. The casing 2 has therein a space 22 to accommodate one wafer 10. One side of the casing 2 is opened as the wafer entrance/exit 21. The vertical length (thickness) of the space 22 of the casing 2 is greater than that of the wafer 10 so that the leading end of a jig (not shown) can be easily inserted into the casing 2 and discharged therefrom when the jig puts the wafer 10 into the casing 2 and discharges it therefrom, respectively. Of an upper surface 23 of the inside of the casing 2 defining the space 22, an intermediate portion 23a which extends over approximately one third of the longitudinal length of the wafer entrance/exit 21 is horizontal. Opposing sides 23b of the upper surface 23 are inclined downward in the directions from the intermediate portion 23a toward respective opposing change ends of the upper surface 23. Of a lower surface 24 of the inside of the casing 2 defining the space 22, an intermediate portion 24a occupying most of the longitudinal length of the wafer entrance/exit 21 is horizontal and end portions 24B in the vicinity of the opposing ends of the lower surface 24 incline upwardly in the directions from the intermediate portion 24a toward respective opposing ends of the lower surface 24. Consequently, the interval between the upper surface 23 of the space 22 and the lower surface 24 thereof becomes narrower in the directions from the central portion of the space 22 toward both ends thereof. The upper surface 23 may be inclined downward and the lower surface 24 may be inclined upward from the central portion thereof toward the ends thereof. But in this case, the thickness of the casing 2 becomes greater or the thickness of the space 22 becomes smaller. Therefore, preferably, only the portions in the vicinity of the opposing ends of the space 22 are inclined. Referring to FIG. 3, the wafer carrier 1 has an urging member 4, disposed between the casing 2 and the cover 3, for urging the cover 3 in the closed direction, namely, in the clockwise direction as shown by an arrow. The urging member 4 according to this embodiment consists of a helical spring provided on the rotational axis 31 of the cover 3, but it may have a different construction. When a driving pin 5 presses a pressing strip 32 provided on the rear end of the cover 3, the cover 3 is opened against the force of the urging member 4. Referring to FIG. 1, a wafer urging member 6 for urging the wafer 10 toward the wafer entrance/exit 21 is provided in a rear portion of the space 22 of the casing 2. The wafer urging member 6 consists of a bow-shaped leaf plate in this embodiment, but it may have a different construction. The casing 2 and the cover 3 are both made of plastics and the leaf plate is also made of plastics.

Figure 4:
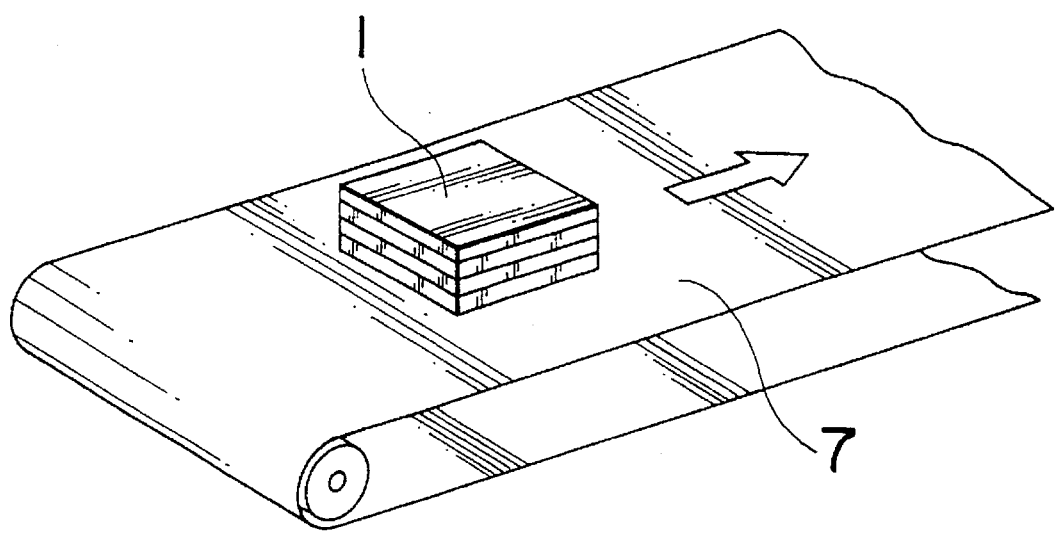
FIG. 4 is a perspective view showing a method for transporting/storing wafers according to an embodiment of the present invention.
Figure 5A:
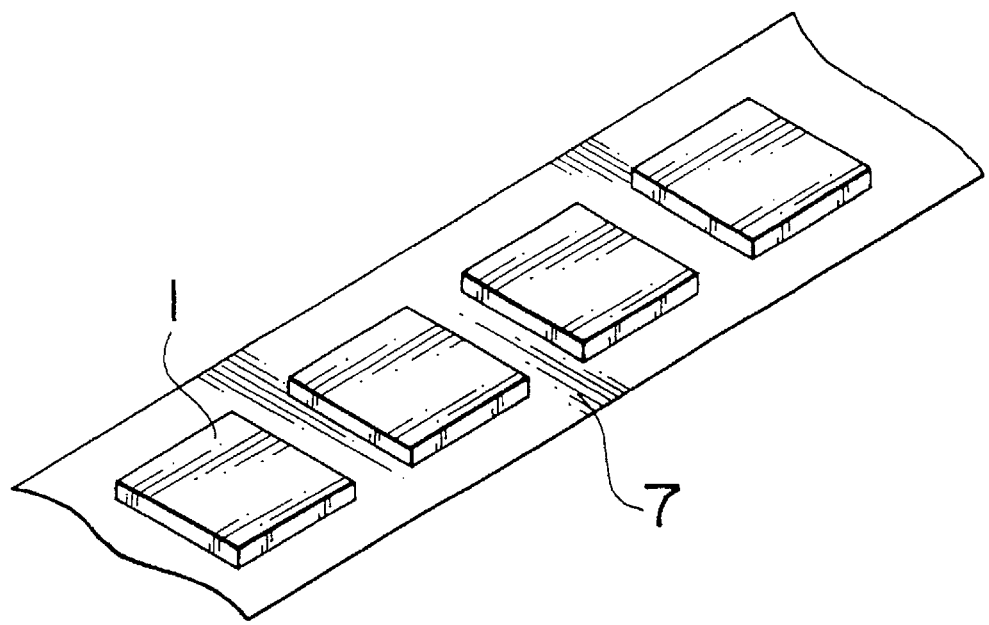
FIG. 5A is a perspective view showing a method for transporting/storing wafers according to another embodiment of the present invention.
Figure 5B:
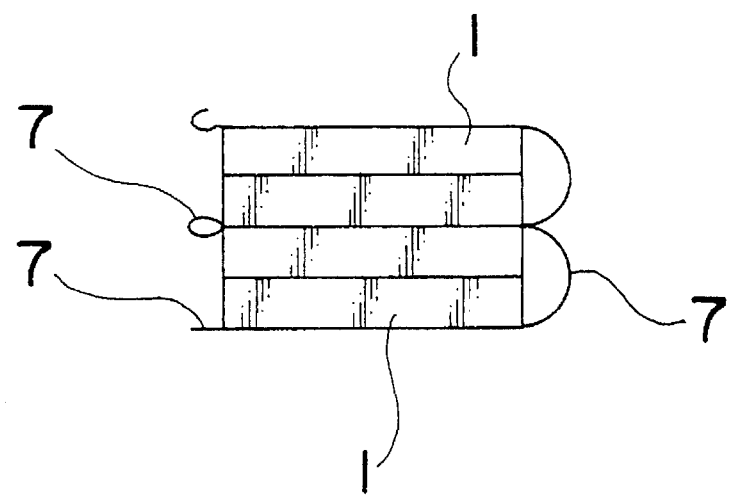
FIG. 5B is a side elevation showing a method for transporting/storing wafers according to still another embodiment of the present invention.
Figure 6A:
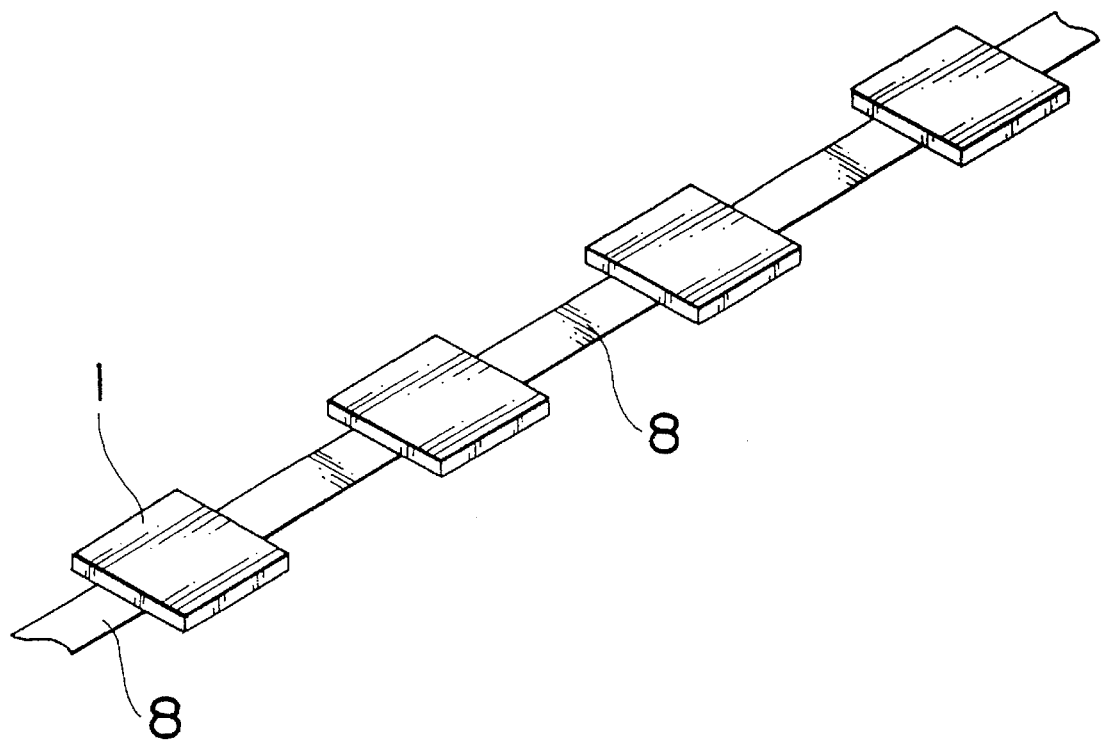
FIG. 6A is a perspective view showing a method for transporting/storing wafers according to a further embodiment of the present invention.
Figure 6B:
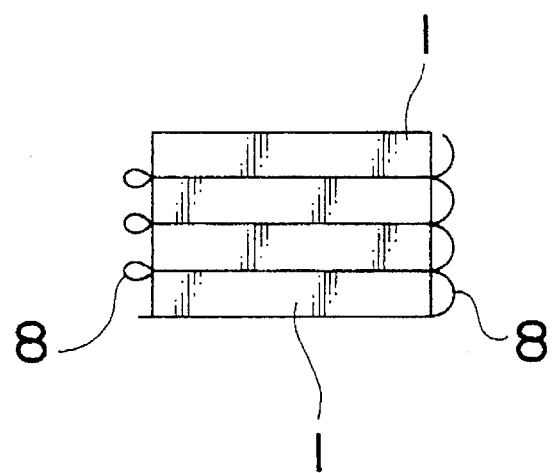
FIG. 6B is a side elevation showing a method for transporting/storing wafers according to a still further embodiment of the present invention.

According to the wafer transporting method, a transporting means 7 such as a belt conveyor transports wafers 10, with each wafer carrier 1 accommodating one wafer 10, as shown in FIG. 4. The wafer carriers 1 are piled one on the other as shown in FIG. 4 so as to transport the wafer carriers 1 to a subsequent processing place with a high efficiency. In order to store the wafers 10, the wafer carriers 1, each accommodating one wafer 10, are piled one on the other. In order to transport/store the wafers 10, it is possible to fix the wafer carriers 1 each accommodating one wafer 10, onto the belt conveyor 7 with the wafer carriers 1 arranged on the belt 7 at regular intervals as shown in FIG. 5A, or it is possible to connect the wafer carriers 1 with each other at regular intervals by a tape 8 as shown in FIG. 6A. It is also possible to transport/store the wafers 10 with the wafer carriers 1 folded in a arrangement as shown in FIGS. 5B and 6B.

As apparent from the foregoing description, according to the method for transporting/storing wafers, wafer carriers are transported and stored with one wafer accommodated in each of the wafer carriers. The wafer is not directly placed or held but placed on the transporting means or held via the wafer carrier when the wafer is transported, placed on the transporting means, removed from the transporting means, stored, placed in the storing place, or removed therefrom. Consequently, the wafer is not damaged. Thus, the wafer can be transported at a high speed.

The edges of the wafer accommodated in the wafer carrier are fixed lengthwise and widthwise by the inner surface of the casing. Therefore, the wafer can be stably accommodated in the wafer carrier and thus will not be damaged during the accommodation thereof. As will be further apparent from the foregoing description, according to the method for transporting/storing wafers of the present invention, the driving pin is moved so that the cover is moved to the wafer entrance and exit open position for the disposition or accommodation of a single wafer in the carrier through the wafer entrance and exit. The driving pin is then moved to close the cover, and subsequently the steps of transporting and storing the carrier can be carried out as discussed above. Subsequently, when it is desired to remove the wafer from the carrier, the driving pin is moved so as to again open the cover, and the single wafer can then be removed from the carrier. After the wafer has been removed, the driving pin can again be moved to allow the cover to close.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A method of transporting or storing a single wafer using a single wafer carrier, the single wafer carrier comprising:

a flat casing having a single-wafer accommodating space defined therein, wherein the single-wafer accommodating space is bounded by upper and lower inner surfaces of the flat casing, the upper and lower inner surfaces having front and rear ends and opposing side ends, and a side surface having an opening formed therein defining a wafer entrance and exit;

a cover movably mounted to the flat casing at the wafer entrance and exit for movement between a wafer entrance and exit closed position and a wafer entrance and exit open position;

a cover urging member operably disposed between the casing and the cover urging the cover toward the wafer entrance and exit closed position; and a means for translating movement of a driving pin on an actuating device to movement of the cover between the wafer entrance and exit closed position and the wafer entrance and exit open position, the means for translating comprising a pressing strip fixedly attached to the cover;

said method comprising the steps of:
 a) moving the driving pin such that the cover is moved to the wafer entrance and exit open position;
 b) disposing a single wafer in the carrier through the wafer entrance and exit;
 c) moving the driving pin so as to move the cover to the wafer entrance and exit closed position;
 d) performing at least one of the steps of transporting and storing the carrier;
 e) moving the driving pin so as to move the cover to the wafer entrance and exit open position;
 f) removing the single wafer through the wafer entrance and exit; and
 g) moving the driving pin so as to move the cover to the wafer entrance and exit closed position.

2. The method of claim 1, wherein in said step e) a part of the wafer is moved outside of the carrier through the wafer entrance and exit when the cover is moved to the wafer entrance and exit open position.

3. A method of transporting or storing a plurality of wafers with wafer carriers, each of the wafer carriers comprising:
 a flat casing having a single-wafer accommodating space defined therein, wherein the single-wafer accommodating space is bounded by upper and lower inner surfaces of the flat casing, the upper and lower inner surfaces having front and rear ends and opposing side ends, and a side surface having an opening formed therein defining a wafer entrance and exit;
 a cover movably mounted to the flat casing at the wafer entrance and exit for movement between a wafer entrance and exit closed position and a wafer entrance and exit open position;
 a cover urging member operably disposed between the casing and the cover urging the cover toward the wafer entrance and exit closed position; and
 a means for translating movement of a driving pin on an actuating device to movement of the cover between the wafer entrance and exit closed position and the wafer entrance and exit open positions, the means for translating comprising a pressing strip fixedly attached to the cover;

said method comprising the steps of:
 a) moving the driving pin such that the cover of one of the carriers is moved to the wafer entrance and exit open position;
 b) disposing a single wafer in the one of the carriers through the wafer entrance and exit;
 c) moving the driving pin such that the cover of the one of the carriers is moved to the wafer entrance and exit closed position;
 d) performing at least one of the steps of transporting and storing the one of the carriers;
 e) moving the driving pin such that the cover of the one of the carriers is moved to the wafer entrance and exit open position;
 f) removing the single wafer through the wafer entrance and exit; and
 g) moving the driving pin such that the cover of the one of the carriers is moved to the wafer entrance and exit closed position.

4. The method of claim 3, wherein in said step e) a part of the single wafer is moved outside of the one of the carriers through the wafer entrance and exit when the cover is moved to the wafer entrance and exit open position.

5. The method of claim 3, wherein said steps a)–g) are carried out for each of the carriers, and said step d) further comprises performing at least one of said steps of transporting and storing each of the wafer carriers with the carriers piled one on top of the other.

6. The method of claim 3, wherein said steps a)–g) are carried out for each of the carriers, and said step d) further comprises performing at least said step of transporting each of the wafer carriers with the wafer carriers being arranged on a belt conveyor.

7. The method of claim 3, wherein said steps a)–g) are carried out for each of the carriers, and said step d) further comprises performing at least one of the steps of transporting and storing each of the wafer carriers with the carriers connected to each other by a tape.

8. The method of claim 4, wherein said steps a)–g) are carried out for each of the carriers, and said step d) further comprises performing at least one of said steps of transporting and storing each of the wafer carriers with the carriers piled one on top of the other.

9. The method of claim 4, wherein said steps a)–g) are carried out for each of the carriers, and said step d) further comprises performing at least said step of transporting each of the wafer carriers with the wafer carriers being arranged on a belt conveyor.

10. The method of claim 4, wherein said steps a)–g) are carried out for each of the carriers, and said step d) further comprises performing at least one of said steps of transporting and storing each of the wafer carriers with the carriers connected to each other by a tape.

* * * * *